United States Patent [19]

Dolazza

[11] Patent Number: 5,031,132

[45] Date of Patent: Jul. 9, 1991

[54] CIRCUIT FOR CONVOLVING A SET OF DIGITAL DATA

[75] Inventor: Enrico Dolazza, Boston, Mass.

[73] Assignee: Analogic Corporation, Peabody, Mass.

[21] Appl. No.: 485,964

[22] Filed: Feb. 27, 1990

[51] Int. Cl.[5] .............................................. G06F 15/31
[52] U.S. Cl. ........................... 364/724.12; 364/724.05; 364/724.17
[58] Field of Search ...................... 364/724.12, 724.05, 364/724.17, 724.01, 728.01

[56] References Cited

U.S. PATENT DOCUMENTS

| | | | |
|---|---|---|---|
| 3,980,873 | 9/1976 | Mattei | 364/724.12 |
| 4,062,060 | 12/1977 | Nussbaumer | 364/724.12 |
| 4,720,871 | 1/1988 | Chambers | 364/728.01 X |
| 4,907,182 | 3/1990 | Giuliano et al. | 364/728.01 |

*Primary Examiner*—Gary V. Harkcom
*Assistant Examiner*—Tan V. Mai
*Attorney, Agent, or Firm*—Iandiorio & Dingman

[57] ABSTRACT

A digital signal filter circuit for convolving a sequence of at least $n+(q+1)$ data samples with a kernel of n coefficients, where the coefficients have as an envelope a polynomial function of degree q, which extracts a first set of $q+1$ contiguous data samples, stores $n-(q+1)$ intermediate data samples following the set of $(q+1)$ contiguous data samples, extracts from the sequence of data samples a second set of $(q+1)$ contiguous data samples that follow the intermediate data samples, linearly combines the data samples of the first and second sets with weighting values that are a function of the coefficients of the polynomials to obtain a linear combination of $(q+2)$ sequential convolved samples with binomial coefficients, and recursively selects at least one of the convolved sample from the linear combination of $(q+2)$ sequential convolved samples.

8 Claims, 6 Drawing Sheets

POLYNOMIALS

Fig. 10

CIRCUIT FOR CONVOLVING A SET OF DIGITAL DATA

FIELD OF INVENTION

This invention relates to a digital signal filter circuit for convolving a sequence of data samples, and more particularly to such a filter system in which the number of multiplication/accumulation operations are independent of the size of the convolving kernel and the data sample.

BACKGROUND OF INVENTION

In signal processing applications such as image processing or audio processing, for example, the number of multiplication/accumulation operations is determined by the size of the convolving kernel. For example, in convolving an image constituted by a matrix of data samples or pixels of 1024×1024 using a convolving kernel of 127×127 coefficients there are more than $16.9 \times 10^9$ operations, or $0.26 \times 10^9$ operations using orthogonal decomposition techniques. Both cases require substantial processor capacity and time to complete the convolution process.

SUMMARY OF INVENTION

It is therefore an object of this invention to provide an improved simpler, less expensive and faster signal filter circuit.

It is a further object of this invention to provide such a signal filter circuit which requires far fewer multiplication/accumulation operations than conventional signal processing systems.

It is a further object of this invention to provide such a signal filter circuit whose number of multiplication/accumulation operations are independent of the size of the convolving kernel.

This invention results from the realization that a truly simpler, faster, effective signal filter circuit can be elegantly achieved, if the envelope of the kernel of coefficients is a polynomial, using only $3(q+1)$ multiplication/accumulation operations, where q is the degree of the polynomial.

The invention features a digital signal filter circuit for convolving a sequence of data samples with a kernel of n coefficients where the coefficients have as an envelope a polynomial function of degree q. There are first means for extracting a first set of $(q+1)$ contiguous data samples. There are means for storing $n-(q+1)$ intermediate data samples following the set of $(q+1)$ contiguous data samples. Second means extract from the sequence of data samples a second set of $(q+1)$ contiguous data samples that follow the intermediate data samples. There are means for linearly combining the data samples of the first and second sets with weighting values that are a function of coefficients of the polynomials to obtain a linear combination of $(q+2)$ sequential convolved samples with binomial coefficients. There are means for recursively selecting at least one of the convolved samples from the linear combination of $(q+2)$ sequential convolved samples.

In a preferred embodiment, the first and second means for extracting includes latch means, and the storing means includes a delay line. The means for combining may include means for multiplying the data samples by the weighting values. The means for combining may also include means for summing the products of the multiplications of the data samples and weighting values. The means for selecting may include $(q+1)$ serial latches providing $(q+1)$ convolved data samples, $(q+1)$ multipliers for multiplying the convolved data samples from the latches by the binomial coefficients, second summing means for combining the outputs of the multipliers and of the first means for summing, for providing the selected convolved sample to the first latch in the series of latches.

DISCLOSURE OF PREFERRED EMBODIMENT

Other objects, features and advantages will occur to those skilled in the art from the following description of a preferred embodiment and the accompanying drawings, in which:

Figure 1:
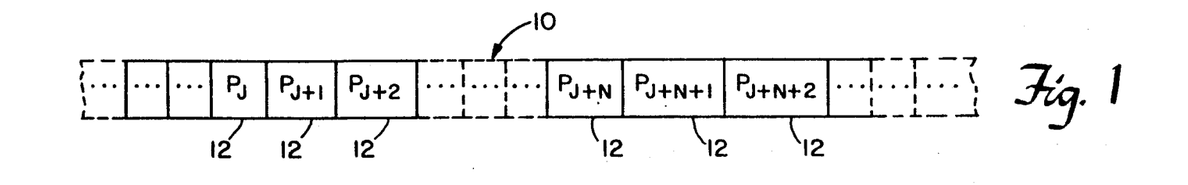
FIG. 1 is a schematic diagram of a stream or sequence of data samples.
Figures 2, 3:
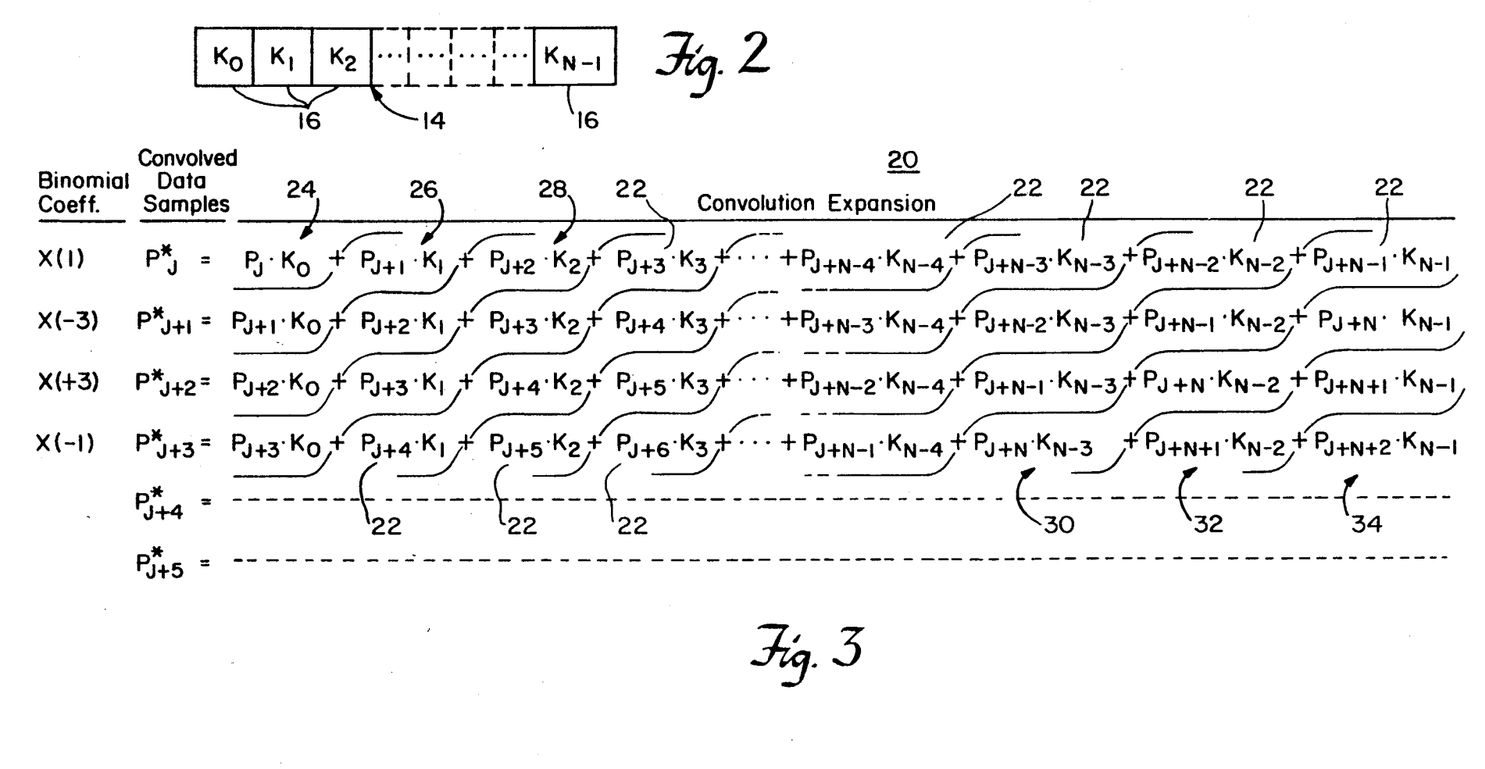
FIG. 2 is a schematic diagram of a sequence of convolving kernel coefficients.
FIG. 3 is a chart showing the expansion resulting from the convolving of the data sample sequence of FIG. 1 by the convolving kernel of FIG. 2.

There is shown in FIG. 1 a stream of data 10 comprising a plurality of data samples, pixels or audio samples 12 which are labelled $P_J, P_{J+1}, P_{J+2}, \ldots P_{J+n}, P_{J+n+1}, P_{J+n+2}, \ldots$ Data stream or data sequence 10 is to be convolved with the kernel 14, FIG. 2, of coefficients 16 which are labelled $K_0, K_1, K_2, \ldots, K_{n-1}$, where kernel 14 has n coefficients. If $$K_J = F(d + J\Delta) \qquad (1)$$

and if F(x) is a polynomial of the order 2, that is q=2, then it is true that a combination of four terms with the proper binomial coefficients, in this case +1, −3, +3 and −1, will equal zero.

$$+1 K_J 3 K_{J-1} + 3 K_{J-2} - 1 K_{J-3} = 0 \qquad (2)$$

Thus, when the data sequence 10 is convolved with kernel 14, the resulting expansion 20 appears as in FIG. 3, where each of the data samples or pixels 12 have been convolved with the entire kernel 14, producing the expression that represents the convolved data samples $P^*_J, P^*_{J+1}, P^*_{J+2}, P^*_{J+3}, \ldots$ Since each of the diagonals labelled 22 contains four terms, each being the product of the same sample multiplied by four contiguous kernel coefficients, then in accordance with Equation (2), if they are multiplied by the proper binomial coefficient, shown at the left in chart 20, FIG. 3, these terms will go to zero, leaving only the expressions in diagonal columns 24, 26 and 28 at the beginning of the series and diagonals 30, 32 and 34 at the end, to be operated upon. The results of this can be shown from Equation (3), where the first three terms, 24a, 24b, 24c, and the last three terms, 30a, 30b and 30c, are retained while all the intermediate terms disappear because they equal zero.

$$P_J^* - 3P^*_{J+1} + 3P^*_{J+2} - P^*_{J+3} = \qquad (3)$$

$$\underbrace{P_J(K_0)}_{24a} + \underbrace{P_{J+1}(K_1 - 3K_0)}_{24b} + \underbrace{P_{J+2}(K_2 - 3K_1 + 3K_0)}_{24c} +$$

$$P_{J+3}(K_3 - 3K_2 + 3K_1 - K_0) + \ldots +$$

$$P_{J+n-1}(K_{n-1} - 3K_{n-2} + 3K_{n-3} - K_{n-4}) +$$

$$\underbrace{P_{J+n}(-3K_{n-1} + 3K_{n-2} - K_{n-3})}_{30a} \underbrace{P_{J+n+1}(3K_{n-1} - K_{n-2})}_{30b}$$

$$\underbrace{P_{J+n+2}(K_{n-1})}_{30c}$$

From this realization, there can be fashioned a truly simple and elegant implementation which uses a minimum of hardware and yet is fast, effective and requires a number of operations which is independent of the size of the kernel and dependent only on the degree of the polynomial representing the envelope of the kernel coefficients.

Figure 4:
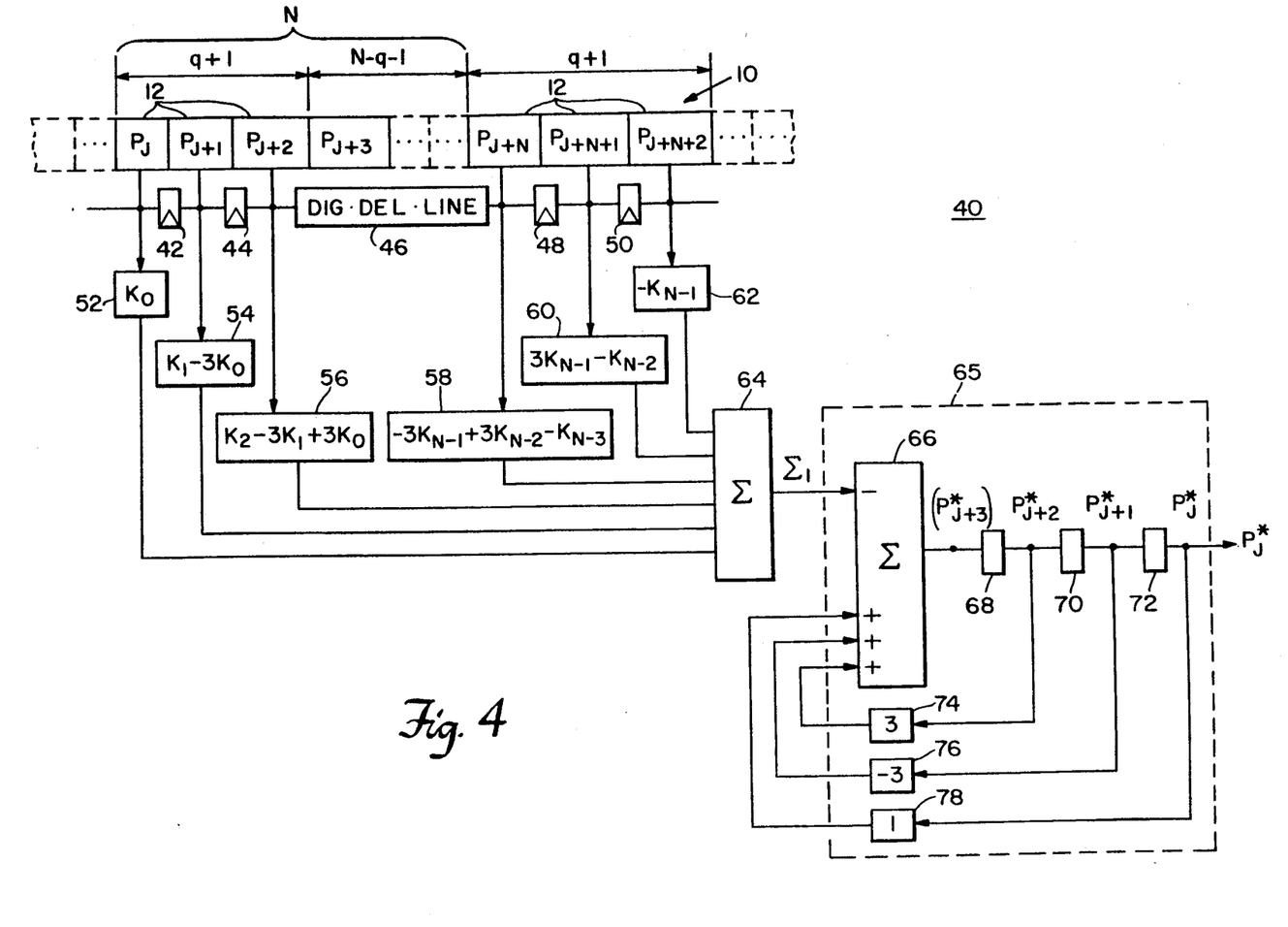
FIG. 4 is a schematic diagram of a digital signal filter circuit according to this invention for a unidimensional convolution.

Such a digital signal filter circuit 40, FIG. 4, according to this invention includes some means for extracting a first sequence of $q+1$ contiguous data samples. In the specific example where $q=2$, the data samples are $P_J$, $P_{J+1}$ and $P_{J+2}$, as shown in the data sample sequence 10 superimposed in FIG. 4. In that case the means for extracting are two latches 42 and 44 and the output of the digital delay line 46. There is some means for storing the $n-(q+1)$ intermediate data samples following the first set, which is shown as a digital delay line 46 and there is some means for extracting a series of data samples of a second set of $q+1$ contiguous data samples that follow the intermediate data samples. The second set is designated $P_{J+n}$, $P_{J+n+1}$, $P_{J+n+2}$, and they are extracted using latches 48 and 50 and processing directly the incoming sample $P_{J+n+2}$. These six data samples are then multiplied in multipliers 52, 54, 56, 58, 60 and 62 by the coefficients $K_0$, $K_1-3K_0$, $K_2-3K_1+3K_0$, $3K_{n-1}+3K_{n-2}-K_{n-3}$, $+3K_{n-1}-K_{n-2}$, and $-K_{n-1}$, as indicated by the terms 24a, b, c and 30a, b, c in Equation (3). After this weighting of the data samples by the kernel coefficients in multipliers 52-62, the products are added in summer 64. The output of summer 64 is $$\Sigma_1 = P^*_J - 3P^*_{J+1} + 3P^*_{J+2} - P^*_{J+3} \qquad (4)$$

The signal $\Sigma_1$ is submitted to a recursive arithmetic circuit 65, which solves for a selected convolved data sample $P^*_{J+3}$ in the form $$P^*_{J+3} = P^*_J - 3P^*_{J+1} + 3P^*_{J+2} - \Sigma_1 \qquad (5)$$

Recursive filter 65 includes a second summer 66 whose output is connected to a series of latches 68, 70 and 72. The output of those latches is multiplied in multipliers 74, 76 and 78 by the binomial coefficients 3, −3 and $\Sigma_1$, respectively, and fed back to summer 66, where they are combined with the negative $\Sigma_1$ signal. Thus equation (5) is implemented and the output of summer 66 reads directly as $P^*_{J+3}$. Subsequent latches, 68, 70 and 72, then, propagate $P^*_{J+2}$, $P^*_{J+1}$, and $P^*_J$. The components used in recursive circuit 65 must be able to handle the full dynamic range of intermediate data to prevent cumulative truncation errors. For any finite value q of the degree of the polynomial involved, the required dynamic range is finite.

For the particular example in which $q=2$, the kernel coefficients K used in multipliers 52-62 are calculated according to the expression:

$$F(x) = a_2 \times^2 + a_1 \times^1 + a_0 \times^0 \qquad (6)$$

This produces for the coefficients $K_0$ through $K_{n-1}$ the following expressions:

$$K_0 = F(d + 0\Delta) = a_0 + a_1 d + a_2 d^2 \qquad (7)$$
$$K_1 = F(d + 1\Delta) = a_0 + a_1(d + \Delta) + a_2(d + \Delta)^2 \qquad (8)$$
$$K_2 = F(d + 2\Delta) = a_0 + a_1(d + 2\Delta) + a_2(d + 2\Delta)^2 \qquad (9)$$
$$K_{n-1} = F(d + (n-1)\Delta) \qquad (10)$$
$$= a_0 + a_1(d + (n-1)\Delta) + a_2(d + (n-1)\Delta)^2$$

The binomial coefficients applied in multipliers 74, 76 and 78 may be calculated in accordance with the expression $$\Sigma_1 = \sum_{i=0}^{q+1} (-1)^i \begin{bmatrix} i \\ q+1 \end{bmatrix} P^*_{J+i} \qquad (11)$$

which provides the following set of binomial coefficients for $q=0$ through $q=5$:

for q=0  1, −1   (12)

for q=1  1, −2, +1   (13)

for q=2  1, −3, +3, −1   (14)

for q=3  1, −4, +6, −4, +1   (15)

for q=4  1, −5, +10, −10, +5, −1   (16)

for q=5  1, −6, +15, −20, +15, −6, +1   (17)

Figure 5:
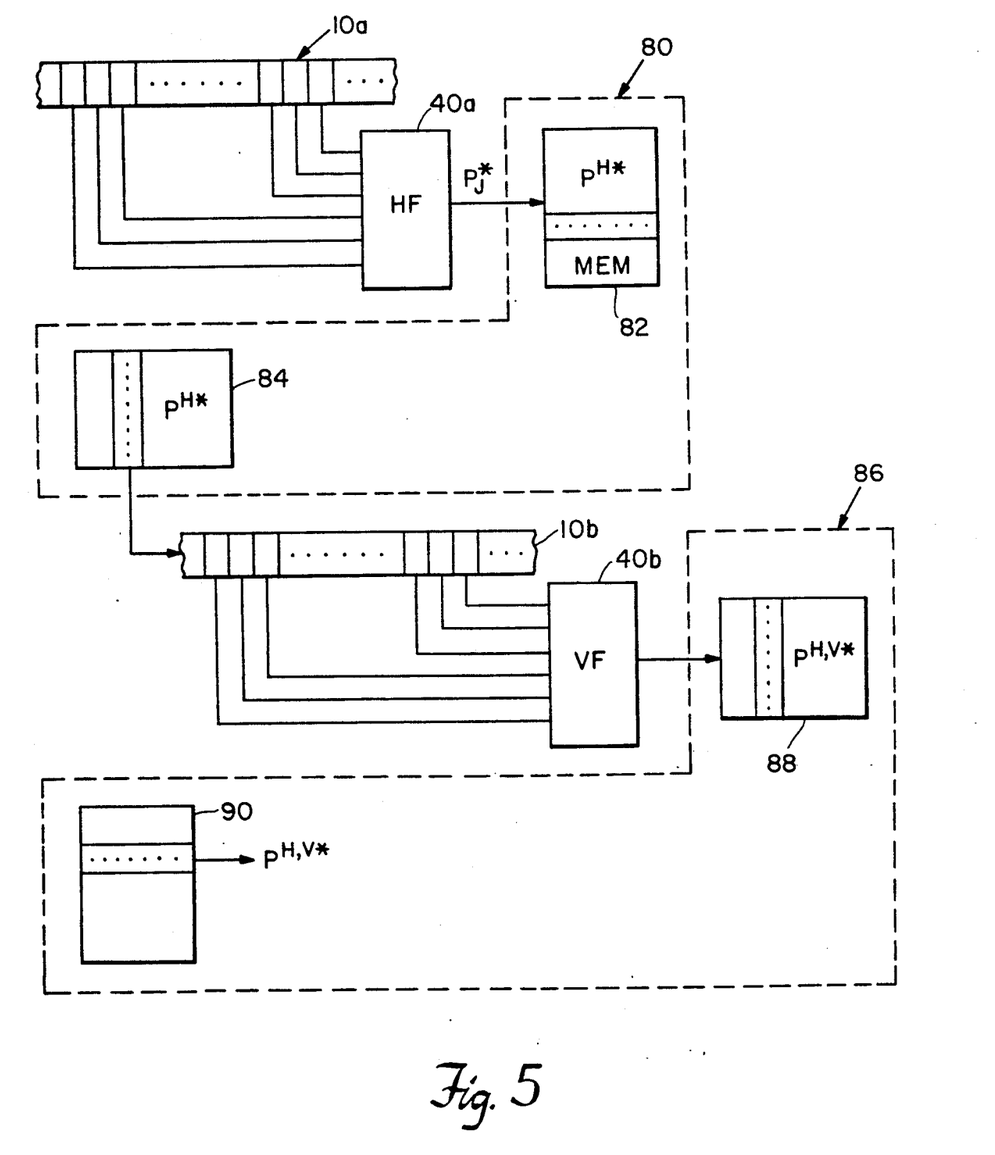
FIG. 5 is a schematic diagram of a digital signal filter circuit according to this invention for a two-dimensional convolution.

While thus far the description has been limited to a discussion of a unidimensional convolution, this is not a necessary limitation of the invention. For example, if the two-dimensional convolving kernel can be decomposed into two orthogonal uni-dimensional convolving kernels, as is normally the case, then as shown in FIG. 5, a two-dimensional image or matrix of information can be fed in, horizontal line by horizontal line, in the manner of data sample sequence 10a, FIG. 5, which is then processed by circuit 40a to produce $P^*_J$, which in this case is equal to $P^{H*}$, the result of the horizontal convolution. These convolved data samples are stored in memory 80 line by line, and then read out column by column. Actually memory 80 may include a first memory 82, which stores the incoming information line by line, and a second memory 84, which is read out column by column. The output of memory 80 creates a second set of data streams or data sample sequences 10b, that are the horizontally convolved columns of the image, which is once again fed to a circuit 40b similar to circuit 40a, where the vertical convolution is accomplished. The output from digital signal filter circuit 40b is then fed to a second memory 86, which may actually include two memories 88, 90. The convolved data samples from circuit 40b are read into memory 88 column by column as convolved data samples $P^{HV^*}$. Now the convolved data samples have been operated on both horizontally and vertically, that is, by line and column. These are then scan converted using memory 90 from which the horizontally and vertically convolved image can be read out, line by line, thus providing the final result.

Figure 6:
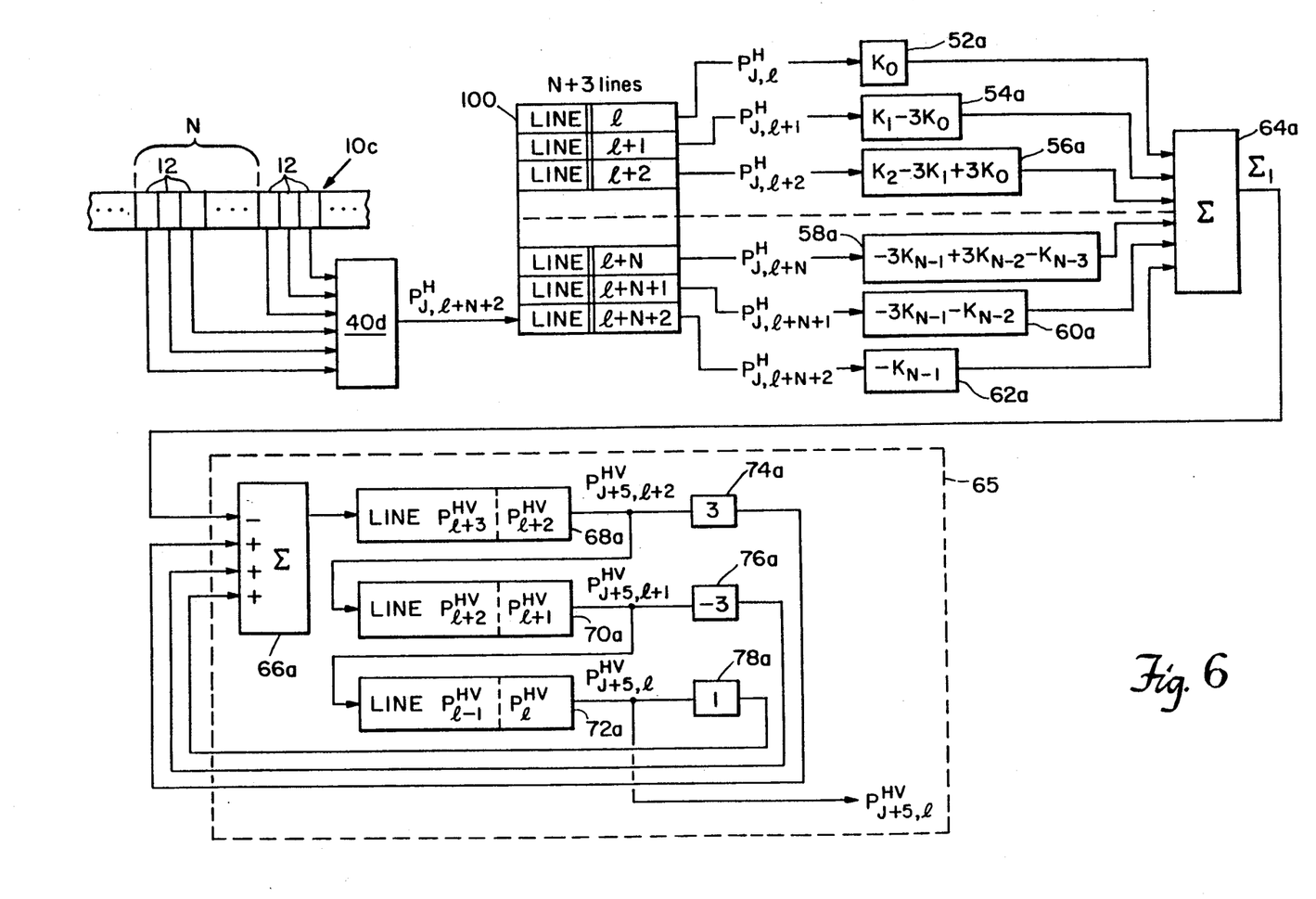
FIG. 6 is a schematic block diagram of an alternative digital signal filter circuit according to this invention for a multi-dimensional convolution.

If four separate memories are used in the embodiment of FIG. 5, for a pixel matrix of 1K pixels×1K pixels, four megapixels of memory is required. If the pairs of memories are combined in the vertical and horizontal procedures, using dual ported memories, then only two megapixels of memory may be required. The amount of memory could be further reduced in a two-dimensional convolution process by using the embodiment shown in FIG. 6. Data streams or sequences of data samples 10c representing the horizontal line of a two-dimensional image, for example, are sequentially operated on by digital signal filter 40d as previously, then the output $P^H{}_{J,\ldots}$ is fed to device 100, that may be implemented as a multiported memory having a storage capacity of $n+3$ lines, or as a set of shift registers. At any given moment in time device 100 stores $n+3$ contiguous image lines, horizontally convolved: line l, line $1+1$, line $1+2, \ldots,$ line $1+n$, line $1+n+1$, and line $1+n+2$. Device 100, also, while it receives as input the horizontally convolved line $1+n+2$, outputs at the same time the horizontally convolved lines 1, $1+1$, $1+2$, $1+n$, $1+n+1$, $1+n+2$, in such a way that vertically corresponding pixels of these lines are simultaneously output. The pixels put out by device 100 are directly fed into mulitipliers 52a-62a and then to summer 64a. The output $\Sigma_1$ from summer 64a is then fed to a second summer 66a in the same fashion as with respect to the original circuit 40 in FIG. 4. The output of summer 66a is fed not to a series of three latches as previously, but to a series of three digital delay lines 68a, 70a, and 72a, each having a storage capacity of one image line, so that circuit 65 operates on image data that, being one image line apart, are vertically aligned, thus implementing the recursive equation (5) in the vertical direction. More specifically, in this alternative embodiment of the invention, the outputs of the digital delay lines are multiplied in multipliers 74a, 76a and 78a by the same coefficients as in FIG. 4 and delivered back to the input of summer 66a, where they are combined with the negative $\Sigma_1$ signal, so that each of the digital delay lines 68a, 70a and 72a produce the sequence of signals $P^{HV}{}_{J+5,l+2}$, $P^{HV}{}_{J+5,l+1}$, $P^{HV}{}_{J+5,l}$, respectively. Thus, with $n+3$ lines stored in memory device 100 and three lines stored in digital delay line systems of circuit 65, there are a total of $n+6$ image lines of storage required, a substantial reduction in memory required over the more straightforward system shown in FIG. 5.

Figures 7, 8:
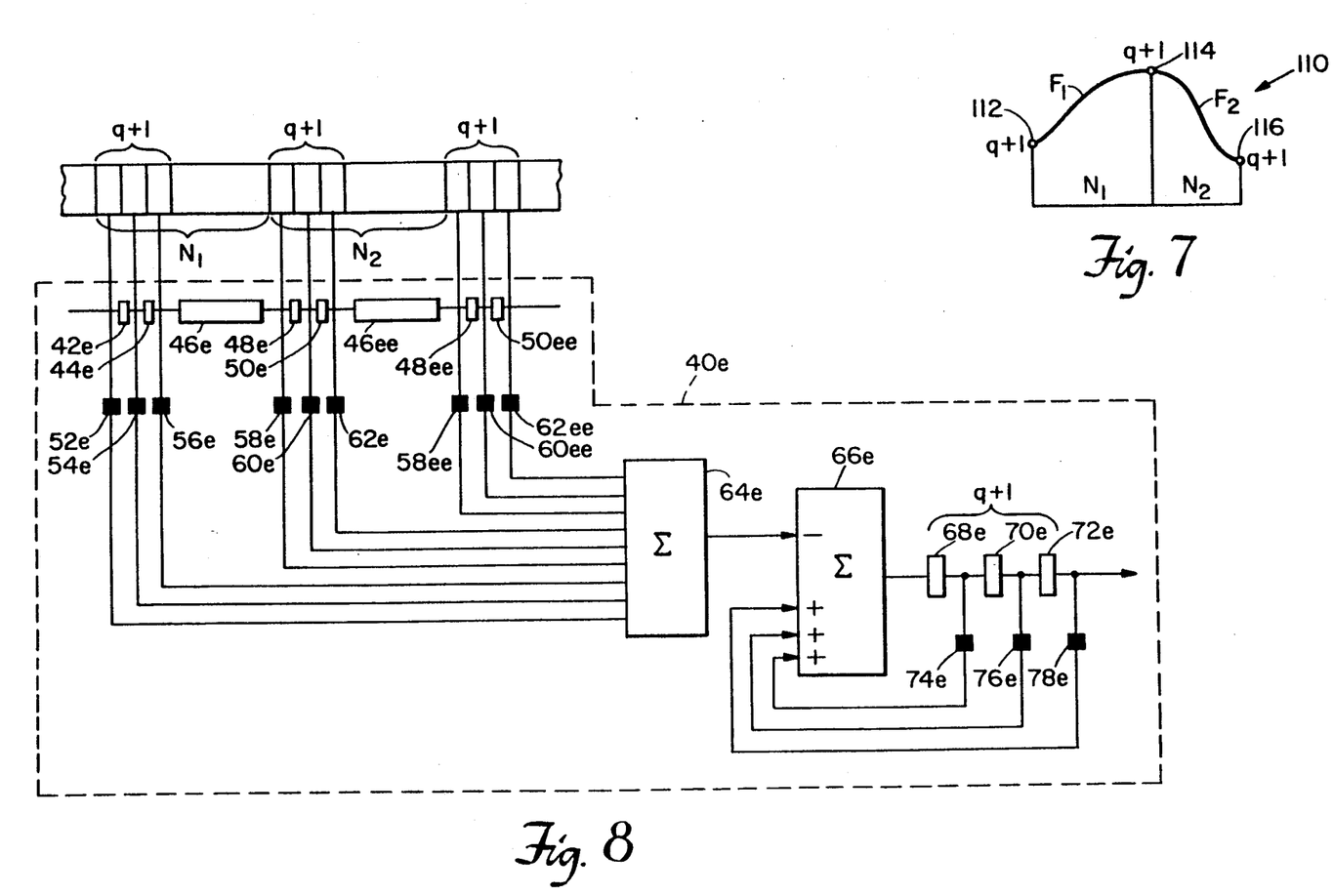
FIG. 7 is a diagram of a kernel coefficient envelope comprising two different polynomial functions.
FIG. 8 is a schematic block diagram of a digital signal filter circuit according to this invention for convolving a sequence of data samples where the kernel envelope is constituted of two different polynomial functions.

Although thus far the description has been illustrated with respect to a kernel coefficient envelope which includes but a single polynomial, this is not a necessary limitation of the invention. For example, with an envelope 110, FIG. 7, that includes two different polynomial functions $F_1$ and $F_2$, both of degree q, there are three regions at which $q+1$ coefficients come into play in actual calculations: one at point 112 at the beginning of function $F_1$; one at point 114 at the junction of $F_1$ and $F_2$, and a third, 116, at the end of function $F_2$. The functions $F_1$ and $F_2$ are illustrated as defined over $n_1$ sampling intervals and $n_2$ sampling intervals respectively. Envelope 110 is served by circuit 40e, FIG. 8, by adding a second delay line 46ee, and additional latches 48ee and 50ee, in conjunction with three additional multipliers 58ee, 60ee and 62ee. Essentially, the number of operations with two different polynomials of the same degree constituting the envelope is equal to $4(q+1)$ instead of $3(q+1)$.

Figure 9:
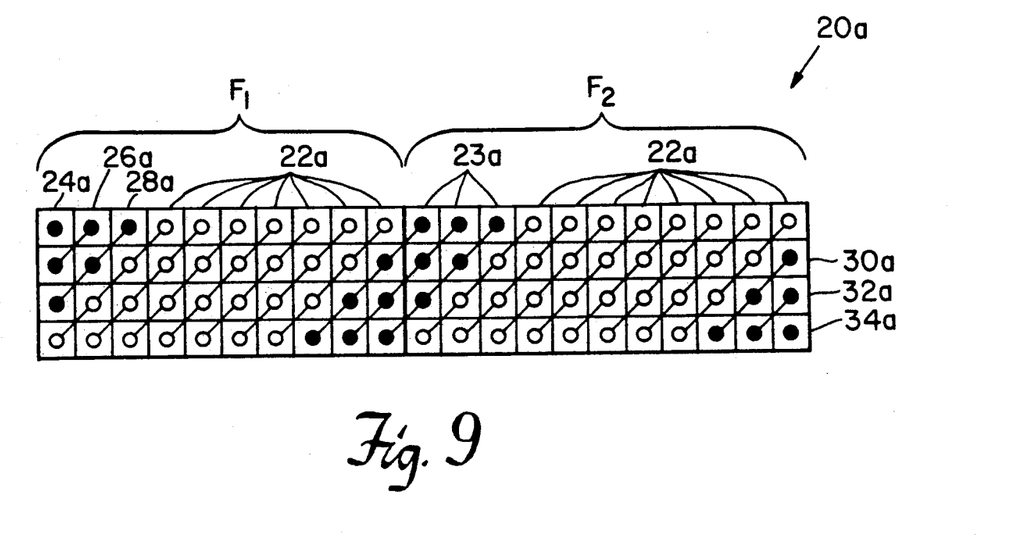
FIG. 9 is an abstract rendering of a chart similar to that shown in FIG. 3 for the case where the kernel coefficient envelope is comprised of two different polynomials.

This can be seen more readily from FIG. 9, where a diagrammatic rendering of expansion 20, FIG. 3, shows the diagonal groups of four terms which add to zero shown in circles, and the terms which do not go to zero shown as solid dots. It is apparent that the three diagonal lines 23a that cross the border between $F_1$ and $F_2$ might equal zero, but not necessarily, since they are parts of two different functions. But even though they do not necessarily equal zero, they can still be summed in just three operations and so only three operations are added by the sequential appearance of two different functions in the envelope.

Figure 10:
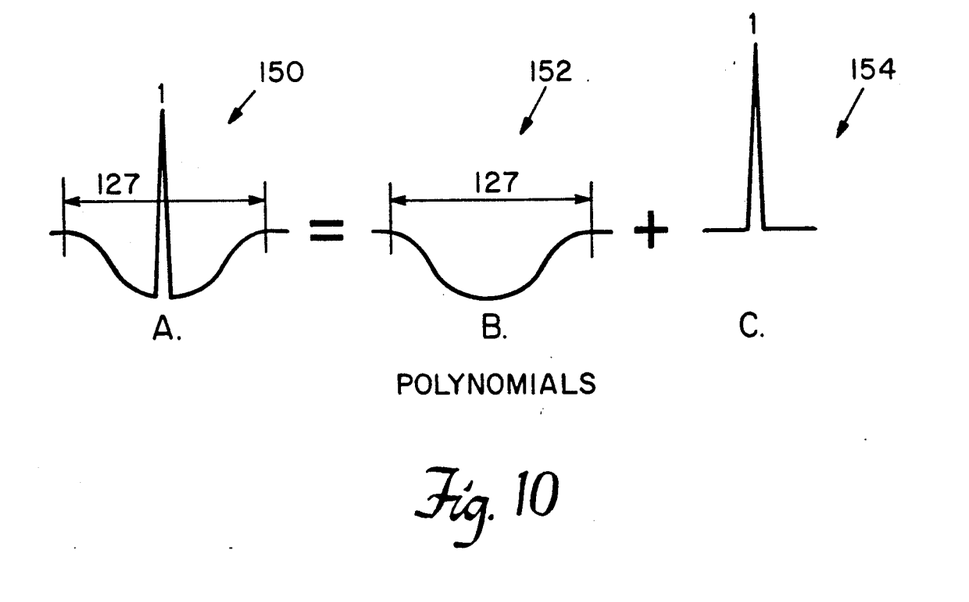
FIG. 10A shows a complex kernel coefficient envelope.
FIGS. 10B and 10C show the polynomial and point data that comprise the envelope of FIG. 10A.

The invention also is applicable to kernel coefficient envelopes which are not wholly polynomials. That is, data samples which are convolved with a kernel which is the combination of two kernels can be expressed as the data sample convolved with one kernel plus the data sample convolved with the other kernel. This is depicted in FIG. 10, where FIG. 10A depicts a composite kernel 150, which is not a polynomial but which can be treated as the sum of a polynomial 152 appearing as in B, and a single coefficient point occurrence 154 as shown in FIG. 10C. With this treatment the kernel represented at 152 which includes 127 coefficients can be dealt with in the efficient fashion taught by this invention, and the single coefficient point illustrated in FIG. 10C can be processed in the conventional fashion where the number of operations involved with just a single coefficient point would not be significant.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A digital signal filter circuit for convolving a sequence of at least $n+(q+1)$ data samples with a kernel of n coefficients where the coefficients have as an envelope a polynomial function of degree g, comprising:
   a source of weighting values that are functions of the coefficients of said polynomial;
   first means for extracting from the sequence of data samples a first set of $q+1$ contiguous data samples;
   means for storing $n-(q+1)$ intermediate data samples following said first set of $q+1$ contiguous data samples;
   second means for extracting from the sequence of data samples a second set of $q+1$ contiguous data samples that follow said intermediate data samples;
   means for linearly combining said data samples of said first and second sets with the weighting values to obtain a linear combination of $(q+2)$ sequential convolved samples with binomial coefficients; and means for recursively selecting at least one of said convolved samples from said linear combination of (q+2) sequential convolved samples.

2. The digital filter circuit of claim 1 in which said first and second means for extracting includes latch means.

3. The digital filter circuit of claim 1 in which said means for storing includes a delay line.

4. The digital filter circuit of claim 1 in which said means for combining includes means for multiplying said data samples by said weighting values.

5. The digital filter circuit of claim 4 in which said means for combining includes first means for summing the products of the multiplications of said data samples and weighting values.

6. The digital filter circuit of claim 1 in which said means for selecting includes (q+1) serial latches for providing (q+1) convolved data samples, (q+1) multipliers for multiplying the convolved data samples from said latches by the binomial coefficients, and second summing means for combining the outputs of said multipliers and of said first means for summing for providing a selected convolved sample to the first latch in said series of latches.

7. A digital signal filter circuit for convolving a two-dimensional array of at least n by n data samples with a kernel of n coefficients where the coefficients have as an envelope a polynomial function of degree g, comprising;

a source of weighting values that are functions of the coefficients of said polynomial;

first means for extracting from the array of data samples a first set of q+1 contiguous data samples in a first dimension;

first means for storing n−(q+1) intermediate first dimension data samples following said set of q+1 contiguous data samples;

second means for extracting from the array of data samples a second set of q+1 contiguous data samples in a first dimension that follow said intermediate first dimension data samples;

first means for linearly combining said first dimension data samples of said first and second sets with the weighting values to obtain a linear combination of (q+2) sequential convolved first dimension samples with binomial coefficients;

first means for recursively selecting said first dimension convolved samples from said linear combination of (q+2) sequential convolved samples to obtain a first dimensional convolvement;

means for storing said first dimensional convolvement;

third means, responsive to said means for storing said first dimensional convolvement, for extracting from said first dimensional convolvement a first set of q+1 contiguous data samples in a second dimension;

second means for storing n−(q+1) intermediate second dimension data samples following said set of q+1 contiguous data samples in a second dimension;

fourth means for extracting from said first dimensional convolvement a second set of q+1 contiguous data samples in a second dimension that follow said intermediate second dimension data samples;

second means for linearly combining said second dimension data samples of said first and second sets with the weighting values to obtain a linear combination of (q+2) sequential convolved second dimension samples with binomial coefficients;

second means for recursively selecting said second dimension convolved samples from said linear combination of (q+2) sequential convolved samples to obtain a second convolvement of the first dimensional convolvement; and means, responsive to said second means for recursively selecting, for storing said second dimensional convolvement to obtain a two-dimensional convolvement of said array.

8. A digital signal filter circuit for convolving a two-dimensional array of at least n by n data samples with a kernel of n coefficients where the coefficients have as an envelope a polynomial function of degree g, comprising;

a source of weighting values that are functions of the coefficients of said polynomial;

first means for extracting from the array of data samples a first set of q+1 contiguous data samples in a first dimension;

first means for storing n−(q+1) intermediate first dimension data samples following said set of q+1 contiguous data samples;

second means for extracting from the array of data samples a second set of q+1 contiguous data samples in a first dimension that follow said intermediate first dimension data samples;

first means for linearly combining said first dimension data samples of said first and second sets with the weighting values to obtain a linear combination of (q+2) sequential convolved first dimension samples with binomial coefficients;

first means for recursively selecting said first dimension convolved samples from said linear combination of (q+2) sequential convolved samples to obtain a first dimensional convolvement;

means, responsive to each first means for recursively selecting; for storing n+2q+2 series of convolved first dimension data samples;

second means for linearly combining at least n+(q+1) data samples in a second dimension of said n+2q+2 series of convolved first dimension data samples with the weighting values to obtain a linear combination of q+2 sequential convolved second dimensional samples with binomial coefficients; and second means, responsive to said second means for linearly combining, for recursively selecting said second dimension convolved samples from said linear combination of (q+2) convolved samples to obtain a two-dimensional convolvement of said array.

* * * * *